United States Patent
Wu

(10) Patent No.: US 10,951,206 B1
(45) Date of Patent: Mar. 16, 2021

(54) OFF CHIP DRIVING SYSTEM AND SIGNAL COMPENSATION METHOD

(71) Applicant: NANYA TECHNOLOGY CORPORATION, New Taipei (TW)

(72) Inventor: Chang-Ting Wu, Hsinchu County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/986,246

(22) Filed: Aug. 5, 2020

(51) Int. Cl.
H03K 17/16 (2006.01)
G11C 16/26 (2006.01)

(52) U.S. Cl.
CPC .................... *H03K 17/161* (2013.01)

(58) Field of Classification Search
CPC combination set(s) only.
See application file for complete search history.

(56) References Cited

U.S. PATENT DOCUMENTS

| | | | |
|---|---|---|---|
| 5,602,494 A | 2/1997 | Sundstrom | |
| 6,281,709 B1 | 8/2001 | Seyyedy | |
| 6,573,753 B1 | 6/2003 | Snyder | |
| 9,998,121 B2 * | 6/2018 | Choi | H03K 19/018571 |
| 10,770,149 B2 * | 9/2020 | Shin | G11C 16/30 |
| 2003/0112042 A1 | 6/2003 | Takahashi | |
| 2015/0171863 A1 | 6/2015 | Ha | |
| 2016/0134285 A1 | 5/2016 | Ha | |
| 2017/0154668 A1 | 6/2017 | Ha | |

* cited by examiner

*Primary Examiner* — An T Luu
(74) *Attorney, Agent, or Firm* — CKC & Partners Co., LLC

(57) ABSTRACT

An off chip driving system includes a decision circuit, multiple first and second adjustable-enhancement circuits, and multiple first and second drivers. The decision circuit outputs a first and a second decision signal according to a clock and an input data. Each first adjustable-enhancement circuit generates one of first control signals in response to the first and the second decision signal and one of first optional signals. Each second adjustable-enhancement circuit generates one of second control signals in response to the first and the second decision signal and one of second optional signals. Each first driver is coupled to the corresponding first adjustable-enhancement circuit and configured to be enabled in response to the corresponding first control signal. Each second driver is coupled to the corresponding second adjustable-enhancement circuit and configured to be enabled in response to the corresponding second control signal.

10 Claims, 7 Drawing Sheets

OFF CHIP DRIVING SYSTEM AND SIGNAL COMPENSATION METHOD

BACKGROUND

Technical Field

The disclosure relates to an off chip driving system and a signal compensation method, particularly to an off chip driving system and a signal compensation method for improving signal distortion.

Description of Related Art

With development of technology, the operation speed of the memory becomes faster and faster. In high speed data transmission, the amplitude of signal is attenuated, causing signal distortion.

Therefore, how to improve signal distortion in high speed data transmission is an important issue in this field.

SUMMARY

One aspect of the present disclosure is an off chip driving system including a decision circuit, a plurality of first adjustable enhancement circuits, a plurality of second adjustable enhancement circuits, a pull-up circuit and a pull-down circuit. The decision circuit is configured to output a first decision signal and a second decision signal according to a clock and an input data. The first adjustable enhancement circuits are coupled to the decision circuit. Each first adjustable enhancement circuit is configured to generate one of a plurality of first control signals in response to the first decision signal, the second decision signal and one of a plurality of first optional signals. The second adjustable enhancement circuits are coupled to the decision circuit. Each second adjustable enhancement circuit is configured to generate one of a plurality of second control signals in response to the first decision signal, the second decision signal and one of a plurality of second optional signals. The pull-up circuit includes a plurality of first drivers. Each first driver is coupled to a corresponding one of the first adjustable enhancement circuits and configured to be enabled in response to a corresponding one of the first control signals. The pull-down circuit includes a plurality of second drivers. Each second driver is coupled to a corresponding one of the second adjustable enhancement circuits and configured to be enabled in response to a corresponding one of the second control signals.

Another aspect of the present disclosure is a signal compensation method. The signal compensation method includes: generating a pulse with a high level as a first decision signal when an input data turns from a first level to a second level; generate a pulse with a low level as a second decision signal when the input data turns from the second level to the first level; generating a plurality of first control signals in response to the first decision signal, the second decision signal and a plurality of first optional signals respectively; generating a plurality of second control signals in response to the first decision signal, the second decision signal and a plurality of second optional signals respectively; enabling a plurality of first drivers in response to the first control signals respectively; and enabling a plurality of second drivers in response to the second control signals respectively.

In summary, in various embodiments of the present disclosure, the number of the control signals that are at the enabling level is controlled by the enabling signals and optional signals, and the time point of the control signals that are at the enabling level is controlled by the decision signals. When and how many the drivers that are turned on are based on the corresponding control signals. Therefore, the slew rates of rising and dropping the output signal are able to be controlled and to meet actual demand.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the diagrams, some of the conventional structures and elements are shown with schematic illustrations.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

In this document, the term "coupled" may also be termed "electrically coupled," and the term "connected" may be termed "electrically connected." "Coupled" and "connected" may also be used to indicate that two or more elements cooperate or interact with each other. In the following description and in the claims, the terms "include"

and "comprise" are used in an open-ended fashion, and thus should be interpreted to mean "include, but not limited to." As used herein, the term "and/or" includes any and all combinations of one or more of the associated listed items.

Figure 1:
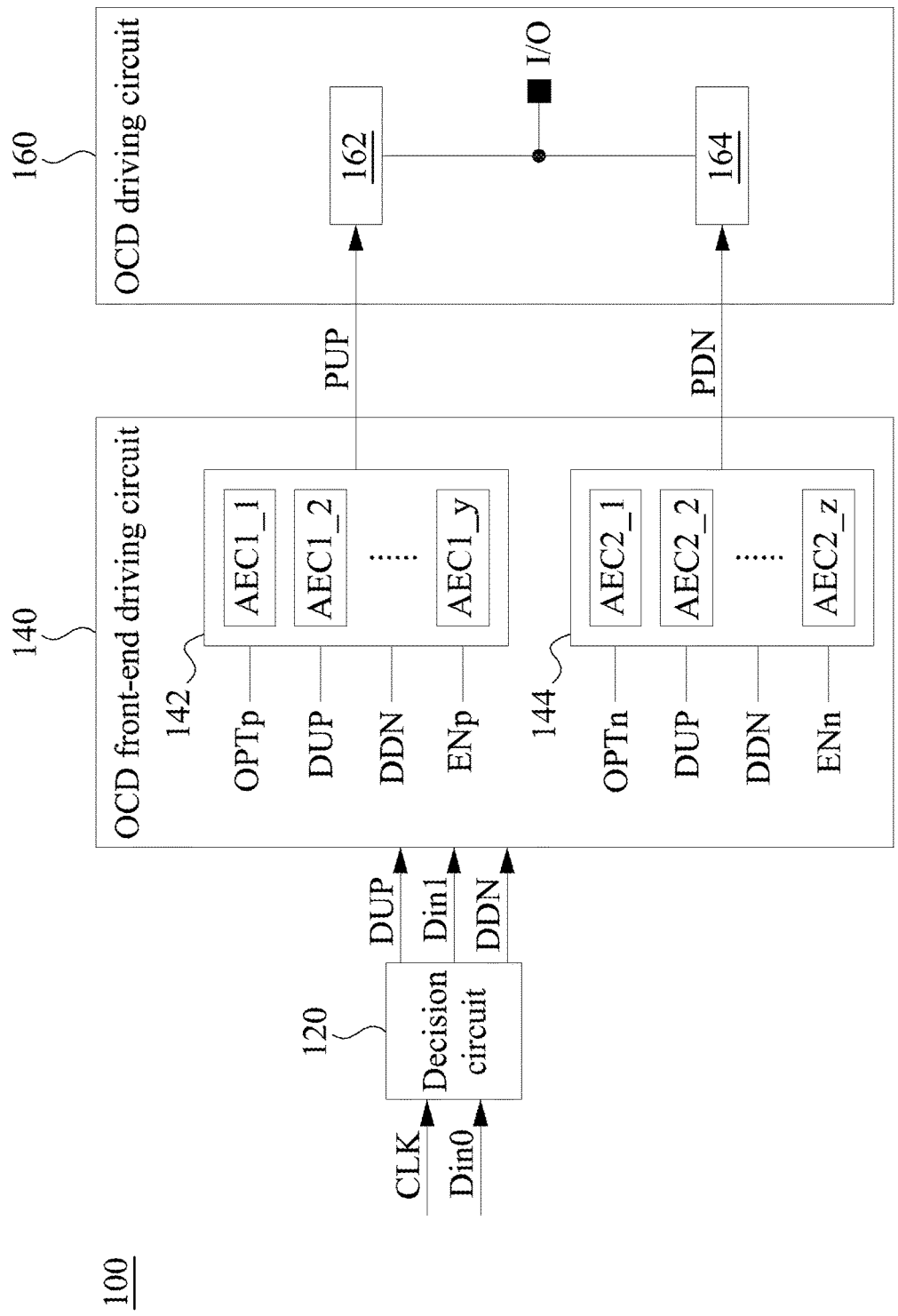
FIG. 1 is a schematic diagram illustrating an off chip driving system in accordance with some embodiments of the disclosure.

Please refer to FIG. 1. FIG. 1 is a schematic diagram illustrating an off chip driving system 100 in accordance with some embodiments of the disclosure. As shown in FIG. 1, the off chip driving system 100 includes a decision circuit 120, an off chip driver (OCD) front-end driving circuit 140 and an off chip driver (OCD) driving circuit 160. In some embodiments, the OCD front-end driving circuit 140 includes a first compensation circuit 142, a second compensation circuit 144. The first compensation circuit 142 includes multiple first adjustable enhancement circuits AEC1_1~AEC1_y. The second compensation circuit 144 includes multiple second adjustable enhancement circuits AEC2_1~AEC2_z. In some embodiments, the OCD driving circuit 160 includes a pull-up driving circuit 162 and a pull-down driving circuit 164. In general, the off chip driving system 100 includes OCD control and ODT control. The signals illustrated in FIG. 1 (e.g., OPTp, DUP, DDN . . . ) are merely a part of OCD control signal. In some other embodiments, there are ODT control signals and other OCD control signals.

In structure, the decision circuit 120 is coupled to the OCD front-end driving circuit 140. The OCD front-end driving circuit 140 is coupled to the OCD driving circuit 160. Specifically, the first compensation circuit 142 is coupled to the decision circuit 120 and the pull-up driving circuit 162. The second compensation circuit 144 is coupled to the decision circuit 120 and the pull-down driving circuit 164.

Figure 2:
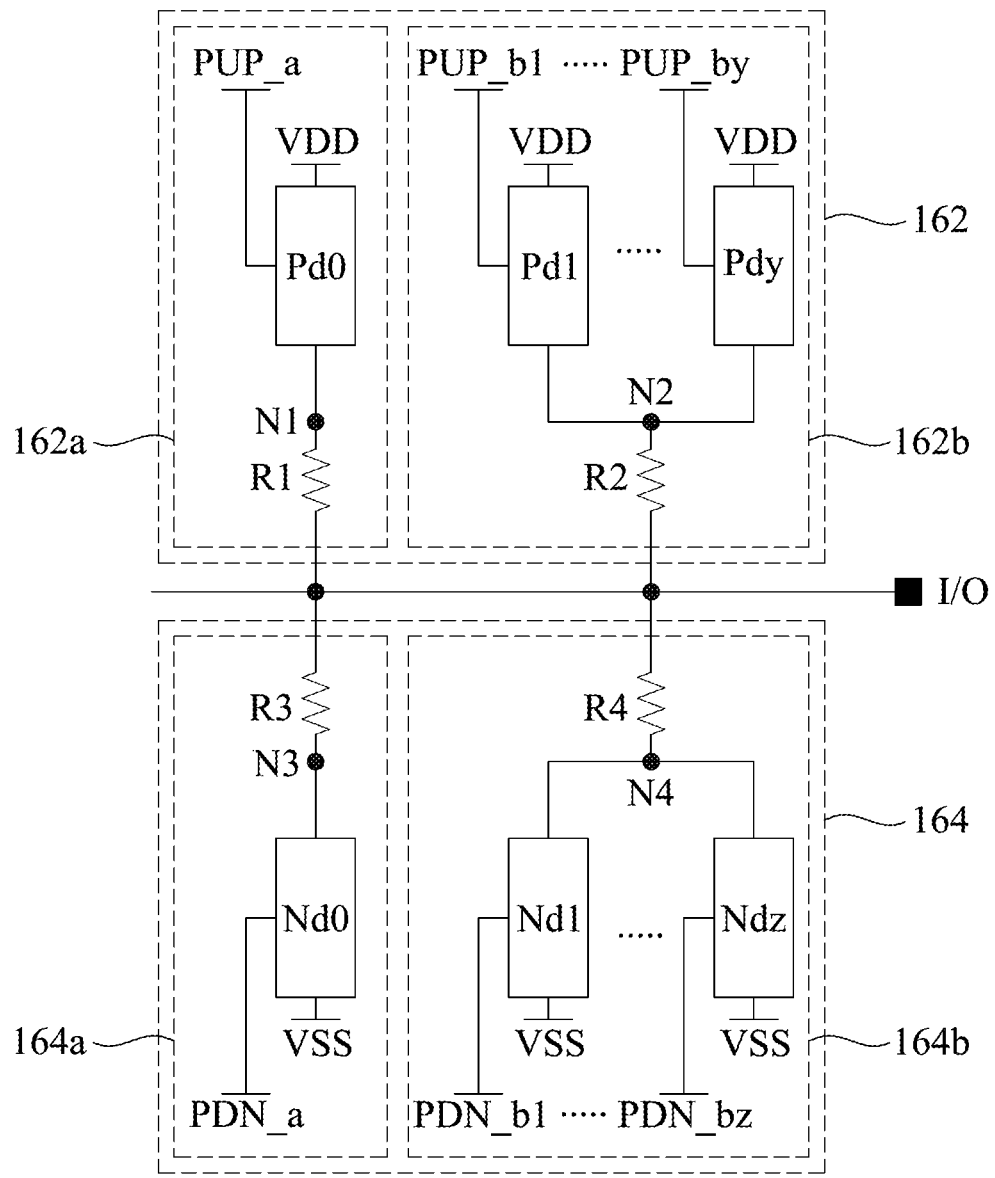
FIG. 2 is a schematic diagram illustrating a pull-up driving circuit and a pull-down driving circuit in accordance with some embodiments of the disclosure.

Please refer to FIG. 2. FIG. 2 is a schematic diagram illustrating the pull-up driving circuit 162 and the pull-down driving circuit 164 in accordance with some embodiments of the disclosure. As shown in FIG. 2, the pull-up driving circuit 162 includes a main unit 162a and an option unit 162b. The main unit 162a includes a P-type driver Pd0 and a resistor R1. The option unit 162b includes multiple P-type drivers Pd1~Pdy and a resistor R2, in which y is an integer.

In structure, the P-type driver Pd0 is coupled to a system high voltage VDD and a node N1. The resistor R1 is coupled to the node N1 and an input/output pad I/O. The P-type drivers Pd1~Pdy are coupled to the system high voltage VDD and a node N2. The resistor R2 is coupled to the node N2 and the input/output pad I/O.

Similarly, as shown in FIG. 2, the pull-down driving circuit 164 includes a main unit 164a and an option unit 164b. The main unit 164a includes a N-type driver Nd0 and a resistor R3. The option unit 164b includes multiple N-type drivers Nd1~Ndz and a resistor R4, in which z is an integer.

In structure, the N-type driver Nd0 is coupled to a system low voltage VSS and a node N3. The resistor R3 is coupled to the node N3 and the input/output pad I/O. The N-type drivers Nd1~Ndz are coupled to the system low voltage VSS and a node N4. The resistor R4 is coupled to the node N4 and the input/output pad I/O. In some embodiments, the values of the resistor R1, R2, R3 and R4 may be 0 or any value larger than 0.

Figure 3D:
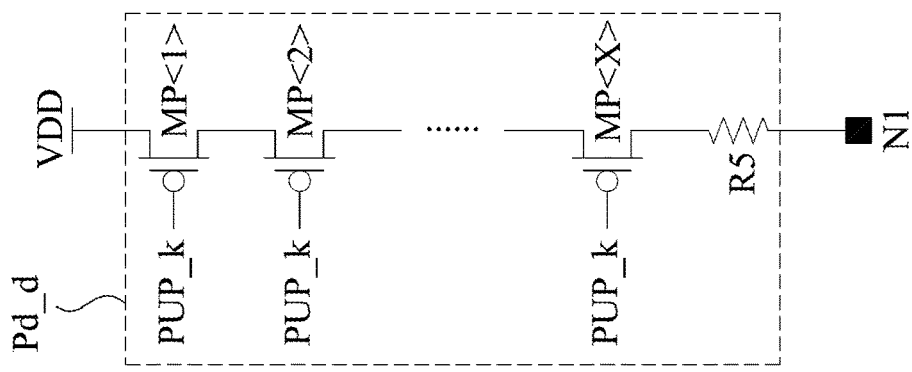
FIGS. 3A~3D are schematic diagrams illustrating P-type drivers in accordance with some embodiments of the disclosure.
Figure 3C:
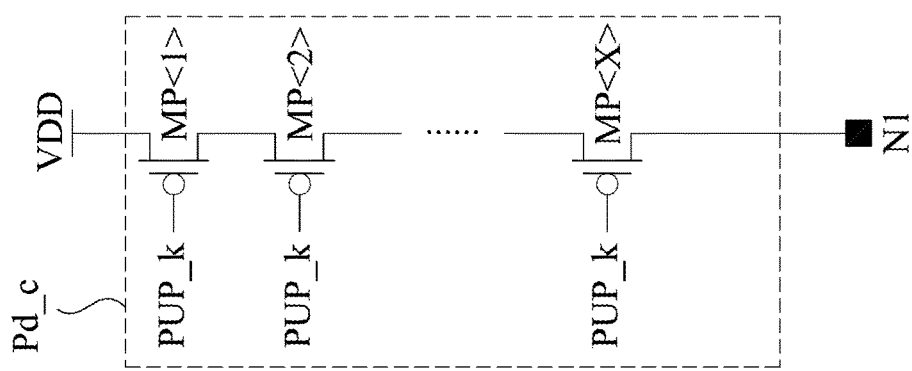
Figure 3B:
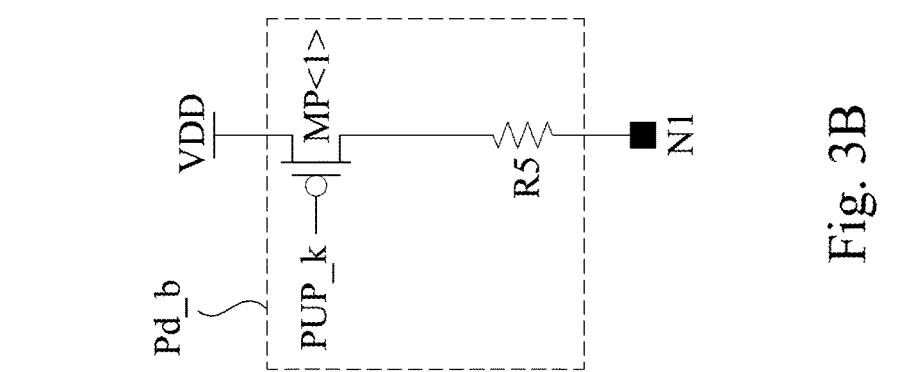
Figure 3A:
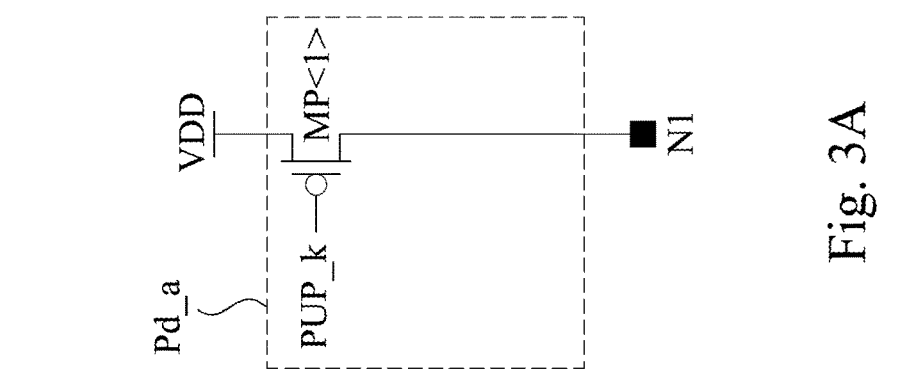
Figure 4D:
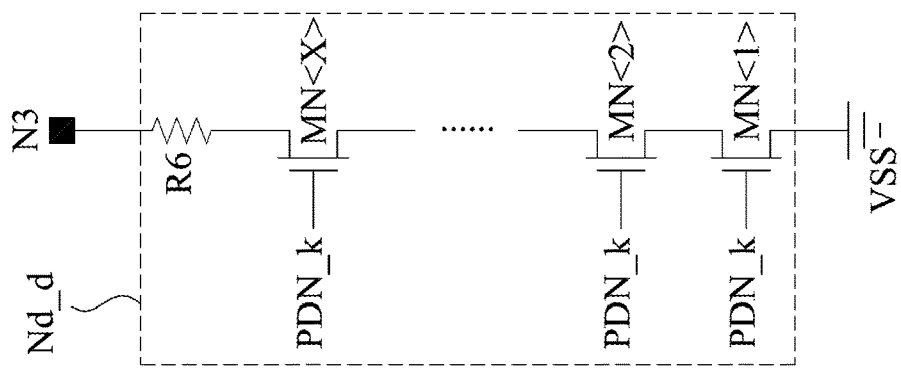
FIGS. 4A~4D are schematic diagrams illustrating N-type drivers in accordance with some embodiments of the disclosure.
Figure 4C:
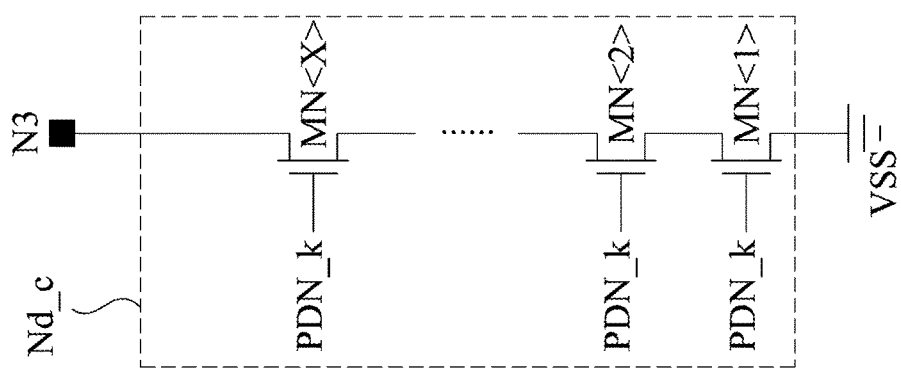
Figure 4B:
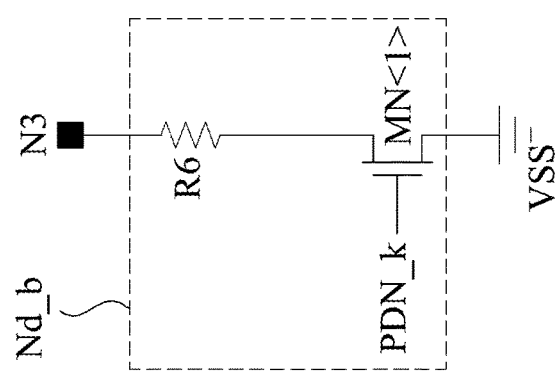
Figure 4A:
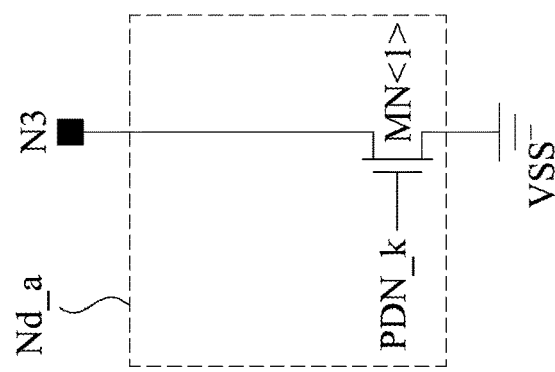

Please refer to FIGS. 3A~3D. FIGS. 3A~3D are schematic diagrams illustrating P-type drivers Pd_a~Pd_d in accordance with some embodiments of the disclosure. In some embodiments, the P-type drivers Pd0~Pdy in FIG. 2 may be realized by the P-type driver Pd_a includes a resistor MP<1>, as shown in FIG. 3A. A first terminal of the transistor MP<1> is coupled to the high voltage VDD. A second terminal of the transistor MP<1> is coupled to the input/output pad I/O. A control terminal of the transistor MP<1> is configured to receive the pull-up control signal PUP_k. The transistor MP<1> is configured to be conducted according to the pull-up control signal PUP_k with a low level, so as to provide the high voltage VDD to the input/output pad I/O.

In some other embodiments, the P-type drivers Pd0~Pdy in FIG. 2 may be realized by the P-type driver Pd_b including the transistor MP<1> and a resistor R5 connected in series, as shown in FIG. 3B, or be realized by the P-type driver Pd_c including multiple transistors MP<1>~MP<X> connected in series, as shown in FIG. 3C, or be realized by the P-type driver Pd_d including multiple transistors MP<1>~MP<X> and the resistor R5 connected in series, as shown in FIG. 3D, in which X is an integer. In structure, a second terminal of the transistor MP<k+1> is coupled to a first terminal of the transistor MP<k>, in which k is an integer smaller than X. In operation, the transistors MP<2>~MP<X> is similar to the transistor MP<1>, thus the explanation is omitted.

It should be noted that, although the P-type drivers Pd0~Pdy in FIG. 2 receive the pull-up control signals PUP_a, PUP_b1~PUP_by, respectively, for the sake of convenience and clarity, in FIGS. 3A~3D, the pull-up control signals received by the P-type drivers Pd_a~Pd_d are all represented by PUP_k. That is, the pull-up control signal PUP_k may be the corresponding one of the pull-up control signals PUP_a, PUP_b1~PUP_by. In addition, the node N1 in FIGS. 3A~3D may be replaced by the node N2 when the P-type drivers Pd_a~Pd_d are implemented the P-type drivers included by the option unit 162b.

Please refer to FIGS. 4A~4D. FIGS. 4A~4D are schematic diagrams illustrating N-type drivers Nd_a~Nd_d in accordance with some embodiments of the disclosure. In some embodiments, the N-type drivers Nd0~Ndz in FIG. 2 may be realized by the N-type drivers Nd_a~Nd_d, as shown in FIGS. 4A-4D, respectively. The N-type driver Nd is similar to the P-type driver Pd, but the p-typed transistors MP<1>~MP<X> are replaced by n-typed transistors MN<1>~MN<X>, the pull-up control signal PUP_k is replaced by the pull-down control signal PDN_k, and the system high voltage VDD is replaced by the system low voltage VSS. In other words, in FIGS. 3A~3D, current flows from top (i.e., the system high voltage VDD) to bottom (i.e., the node N1), and in FIGS. 4A~4D, current flows from top (i.e., the node N3) to bottom (i.e., the system low voltage VSS). For the sake of brevity, the further detail explanation is not repeated herein.

Similarly, although the N-type drivers Nd0~Ndz in FIG. 2 receive the pull-down control signals PDN_a, PDN_b1~PDN_bz, respectively, for the sake of convenience and clarity, in FIGS. 4A~4D, the pull-down control signals received by the N-type drivers Nd_a~Nd_d are all represented by PDN_k. That is, the pull-down control signal PDN_k may be the corresponding one of the pull-down control signals PDN_a, PDN_b1~PDN_bz. In addition, the node N3 in FIGS. 4A~4D may be replaced by the node N4 when the N-type drivers Nd_a~Nd_d are implemented the N-type drivers included by the option unit 164b.

It should be noted that the P-type drivers Pd_a~Pd_d and the N-type drivers Nd_a~Nd_d are merely examples, and not intended to limit the present disclosure. Any circuit that implements the pull-up driver and the pull-down driver is within the scope of this disclosure. That is, the design of the pull-up driving circuit 162 and the pull-down driving circuit 164 may be adjusted by those of ordinary skills in the art.

Please refer back to FIG. 1. In configurationally, the decision circuit 120 is configured to receive a clock CLK and an input data Din0, and to output a first decision signal DUP and a second decision signal DDN according to the input data Din0. The OCD front-end driving circuit 140 is configured to receive the input data Din1, the first decision signal DUP and the second decision signal DDN. The first compensation circuit 142 is configured to generate a pull-up control signal PUP according to the first decision signal DUP, the second decision signal DDN, an first optional signal OPTp and a first enabling signal ENp, and configured to output the pull-up control signal PUP to the pull-up driving circuit 162. The second compensation circuit 144 is configured to generate a pull-down control signal PDN according to the first decision signal DUP, the second decision signal DDN, an second optional signal OPTn and a second enabling signal ENn, and configured to output the pull-down control signal PDN to the pull-down driving circuit 164. The pull-up driving circuit 162 is configured to provide the system high voltage to the input/output pad I/O according to the pull-up control signal PUP. The pull-down driving circuit 164 is configured to provide the system low voltage to the input/output pad I/O according to the pull-down control signal PDN.

It should be noted that, for the sake of convenience and clarity, as the following formulas (a) and (b) shown, the pull-up control signal PUP illustrated in FIG. 1 represents multiple pull-up control signals PUP_a and PUP_b1~PUP_by illustrated in FIG. 2, and the pull-down control signal PDN illustrated in FIG. 1 represents multiple pull-down control signals PDN_a and PDN_b1~PDN_bz illustrated in FIG. 2. Similarly, the first optional signal OPTp illustrated in FIG. 1 represents multiple first optional signals OPTp_1~OPTp_y illustrated in FIG. 5, and the second optional signal OPTn illustrated in FIG. 1 represents multiple second optional signals OPTn_1~OPTn_z illustrated in FIG. 5. The first enabling signal ENp illustrated in FIG. 1 represents multiple first enabling signals ENp_1~ENp_y illustrated in FIG. 5, and the second enabling signal ENn illustrated in FIG. 1 represents multiple second enabling signals ENn_1~ENn_z illustrated in FIG. 5.

$$PUP=PUP\_a+PUP\_b1+PUP\_b2+\ldots+PUP\_by \quad \text{formula (a)}$$

$$PDN=PDN\_a+PDN\_b1+PDN\_b2+\ldots+PDN\_by \quad \text{formula (b)}$$

Conventionally, the drivers Pd1~Pdy of the option unit 162*b* and the drivers Nd1~Ndz of the option unit 164*b* are configured to selectively turn on according to the optional signals OPTp_1~OPTp_y and OPTn_1~OPTn_z, respectively, and the optional signals OPTp_1~OPTp_y and OPTn_1~OPTn_z are determined based on ZQ-calibration. In the present disclosure, the drivers Pd1~Pdy and Nd1~Ndz are configured to selectively turn on according to the control signals PUP_b1~PUP_by and PDN_b1~PDN_bz respectively, and the control signals PUP_b1~PUP_by and PDN_b1~PDN_bz are determined according to the first decision signal DUP, the second decision signal DDN, the optional signals OPTp_1~OPTp_y and OPTn_1~OPTn_z and the first enabling signals ENp_1~ENp_y, respectively.

Figure 5:
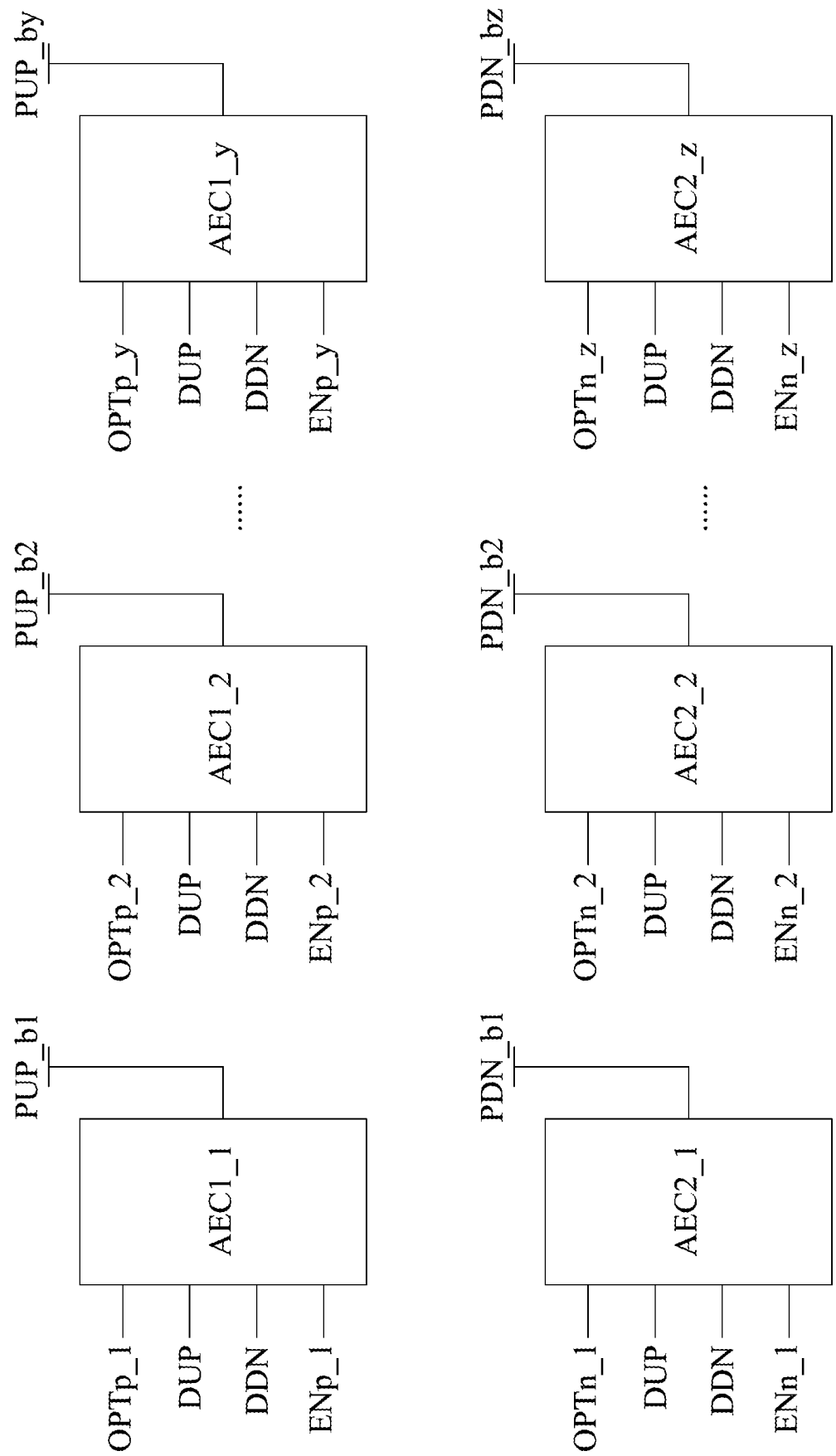
FIG. 5 is a schematic diagram illustrating first adjustable enhancement circuits and second adjustable enhancement circuits in accordance with some embodiments of the disclosure.

Specifically, please refer to FIG. 1, FIG. 2 and FIG. 5 together. FIG. 5 is a schematic diagram illustrating first adjustable enhancement circuits AEC1_1~AEC1_*y* and second adjustable enhancement circuits AEC2_1~AEC2_*z* in accordance with some embodiments of the disclosure. As shown in FIG. 5, each first adjustable enhancement circuit AEC1_1~AEC1_*y* is configured to receive the first decision signal DUP, the second decision signal DDN, a corresponding one of the first optional signals OPTp_1~OPTp_y and a corresponding one of the first enabling signals ENp_1~ENp_y, and configured to generate a corresponding one of the pull-up control signals PUP_b1~PUP_by. For example, the first adjustable enhancement circuit AEC1_1 outputs the first optional signal OPTp_1 as the pull-up control signal PUP_b1 when the first enabling signal ENp_1 is at the low level, and the first adjustable enhancement circuit AEC1_1 outputs the system high voltage or the system low voltage as the pull-up control signal PUP_b1 when the first enabling signal ENp_1 is at the high level. The first adjustable enhancement circuits AEC1_2~AEC1_*y* are similar to the first adjustable enhancement circuit AEC1_1, thus the description is omitted.

As shown in FIG. 2, each P-type driver Pd1~Pdy is configured to selectively turn on according to the corresponding one of the pull-up control signals PUP_b1~PUP_by. For example, the P-type driver Pd1 turns off when the pull-up control signal PUP_b1 is at the high level, and P-type driver Pd1 turns on when the pull-up control signal PUP_b1 is at the low level. In other words, the first adjustable enhancement circuits AEC1_1~AEC1_*y* corresponds to the P-type drivers Pd1~Pdy, respectively. Each first adjustable enhancement circuits AEC1_1~AEC1_*y* outputs the corresponding pull-up control signal PUP_b1~PUP_by according to the corresponding first enabling signal ENp_1~ENp_y, and controls the corresponding P-type driver Pd1~Pdy to turn on or off according to the corresponding pull-up control signal PUP_b1~PUP_by. It should be noted that, as shown in FIG. 2, the P-type driver Pd0 of the main unit 162*a* is configured to selectively turn on according to the pull-up control signal PUP_a. The pull-up control signal PUP_a may be determined based on the input data Din1. That is, in the present disclosure, the operation of the option unit 162*b* is changed by the first adjustable enhancement circuits AEC1_1~AEC1_*y*. The operation of the main unit 162*a* is not charged.

Similarly, as shown in FIG. 5, each second adjustable enhancement circuit AEC2_1~AEC2_*z* is configured to receive the first decision signal DUP, the second decision signal DDN, a corresponding one of the second optional signals OPTn_1~OPTn_z and a corresponding one of the second enabling signals ENn_1~ENn_z, and configured to generate a corresponding one of the pull-down control signals PDN_b1~PDN_bz. For example, the second adjustable enhancement circuit AEC2_1 outputs the second optional signal OPTn_1 as the pull-down control signal PDN_b1 when the second enabling signal ENn_1 is at the low level, and the second adjustable enhancement circuit AEC2_1 outputs the system high voltage or the system low voltage as the pull-down control signal PDN_b1 when the second enabling signal ENn_1 is at the high level. The second adjustable enhancement circuits AEC2_2~AEC2_*z* are similar to the second adjustable enhancement circuit AEC2_1, thus the description is omitted.

As shown in FIG. 2, each N-type driver Nd1~Ndz is configured to selectively turn on according to the corresponding one of the pull-down control signals PDN_b1~PDN_bz. For example, the N-type driver Nd1 turns off when the pull-down control signal PDN_b1 is at the low level, and N-type driver Nd1 turns on when the pull-down control signal PDN_b1 is at the high level. In other words, the second adjustable enhancement circuits AEC2_1~AEC2_*z* corresponds to the N-type drivers Nd1~Ndz, respectively. Each second adjustable enhancement circuits AEC2_1~AEC2_*z* outputs the corresponding pull-down control signal PDN_b1~PDN_bz according to the corresponding second enabling signal ENn_1~ENn_z, and controls the corresponding N-type driver Nd1~Ndy to turn on or off according to the corresponding pull-down control signal PDN_b1~PDN_bz. It should be noted that, as shown in FIG. 2, the N-type driver Nd0 of the main unit 164a is configured to selectively turn on according to the pull-down control signal PDN_a. The pull-down control signal PDN_a may be determined based on the input data Din1. That is, in the present disclosure, the operation of the option unit 164b is changed by the second adjustable enhancement circuits AEC2_1~AEC2_z. The operation of the main unit 164a is not charged.

Figure 6:
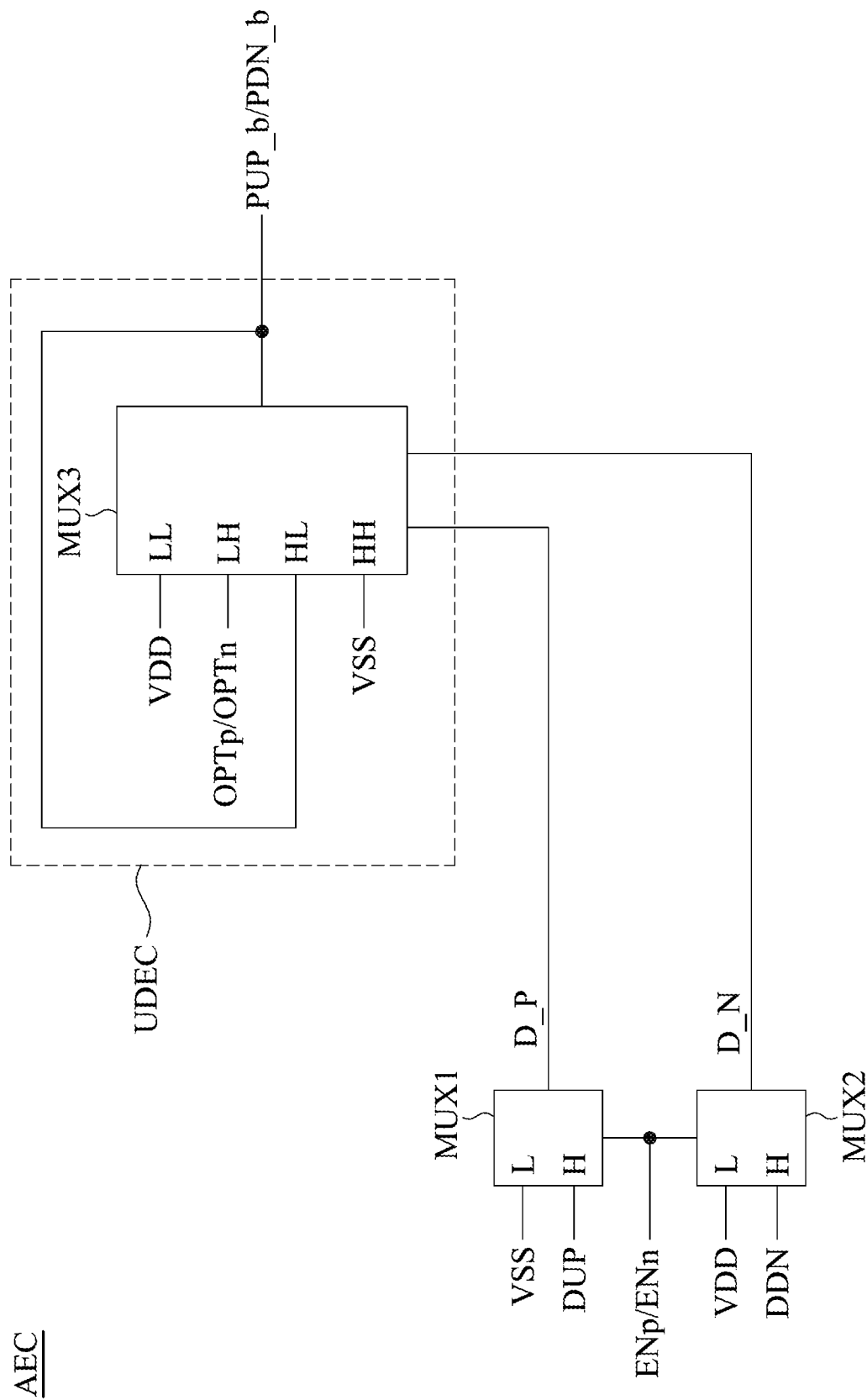
FIG. 6 is a schematic diagram illustrating an adjustable enhancement circuit in accordance with some embodiments of the disclosure.

Please refer to FIG. 6. FIG. 6 is a schematic diagram illustrating an adjustable enhancement circuit AEC in accordance with some embodiments of the disclosure. In some embodiments, the adjustable enhancement circuit AEC illustrated in FIG. 6 may be used to implement the first adjustable enhancement circuits AEC1_1~AEC1_y and the second adjustable enhancement circuits AEC2_1~AEC2_z illustrated in FIG. 1 and FIG. 5. As shown in FIG. 6, the adjustable enhancement circuit AEC includes two multiplexers MUX1, MUX2 and an up down enhancement controller UDEC.

Specifically, an input terminal with 'L' pin of the multiplexer MUX1 is coupled to the system low voltage VSS. An input terminal with 'H' pin of the multiplexer MUX1 is configured to receive the first decision signal DUP. A control terminal of the multiplexer MUX1 is configured to receive the corresponding enabling signal ENp/ENn. The multiplexer MUX1 outputs the system low voltage VSS as the third decision signal D_P when the enabling signal ENp/ENn is at the low level, and outputs the first decision signal DUP as the third decision signal D_P when the enabling signal ENp/ENn is at the high level.

Similarly, an input terminal with 'L' pin of the multiplexer MUX2 is coupled to the system high voltage VDD. An input terminal with 'H' pin of the multiplexer MUX2 is configured to receive the second decision signal DDN. A control terminal of the multiplexer MUX2 is configured to receive the corresponding enabling signal ENp/ENn. The multiplexer MUX2 outputs the system high voltage VDD as the fourth decision signal D_N when the enabling signal ENp/ENn is at the low level, and outputs the second decision signal DDN as the fourth decision signal D_N when the enabling signal ENp/ENn is at the high level.

It should be noted that the adjustable enhancement circuit AEC illustrated in FIG. 6 is merely an example, and any circuit that can implement the True table 1 may realize the adjustable enhancement circuit AEC.

True table 1

| ENp/ENn | D_P | D_N | PUP/PDN |
|---|---|---|---|
| L | L | H | OPTp/OPTn |
| H | DUP | DDN | according to True table 2 |

In some embodiments, the up down enhancement controller UDEC may be implemented by a multiplexer MUX3. As show in FIG. 6, the multiplexer MUX3 is a 2-to-4 multiplexer. An input terminal with 'HH' pin of the multiplexer MUX3 is coupled to the system low voltage VSS. An input terminal with 'LL' pin of the multiplexer MUX3 is coupled to the system high voltage VDD. An input terminal with 'LH' pin of the multiplexer MUX3 is configured to receive the corresponding optional signal OPTp/OPTn. An input terminal with 'HL' pin of the multiplexer MUX3 is floating or coupled to an output terminal of the multiplexer MUX3. Two control terminals of the multiplexer MUX3 is configured to receive the third decision signal D_P and the fourth decision signal D_N.

The multiplexer MUX3 outputs the system high voltage VDD as the control signal PUP_b/PDN_b when the third decision signal D_P and the fourth decision signal D_N are both at the low level. The multiplexer MUX3 outputs the system low voltage VSS as the control signal PUP_b/PDN_b when the third decision signal D_P and the fourth decision signal D_N are both at the high level. The multiplexer MUX3 outputs the optional signal OPTp/OPTn as the control signal PUP_b/PDN_b when the third decision signal D_P is at the low level and the fourth decision signal D_N is at the high level.

It should be noted that the up down enhancement controller UDEC illustrated in FIG. 6 is merely an example, and any circuit that can implement the True table 2 may realize the up down enhancement controller UDEC.

True table 2

| D_P | D_N | PUP_b/PDN_b |
|---|---|---|
| L | L | VDD |
| L | H | OPTp/OPTn |
| H | L | keep or floating |
| H | H | VSS |

In this way, when the enabling signals ENp and ENn are at the low level, the optional signals OPTp_1~OPTp_y and OPTn_1~OPTn_z determined by ZQ-calibration are taken as the control signals PUP and PDN. When the enabling signals ENp and ENn are at the high level, the levels of all the control signals PUP_b and PDN_b are based on the first decision signal DUP and the second decision signal DDN. Thus, no matter how many the optional signals OPTp_1~OPTp_y and OPTn_1~OPTn_z determined by ZQ-calibration is, by setting all the enabling signals ENp and ENn to the high level, all the drivers of the option units 162b and 164b may be operated according to the decision signals DUP and DDN.

Figure 7:
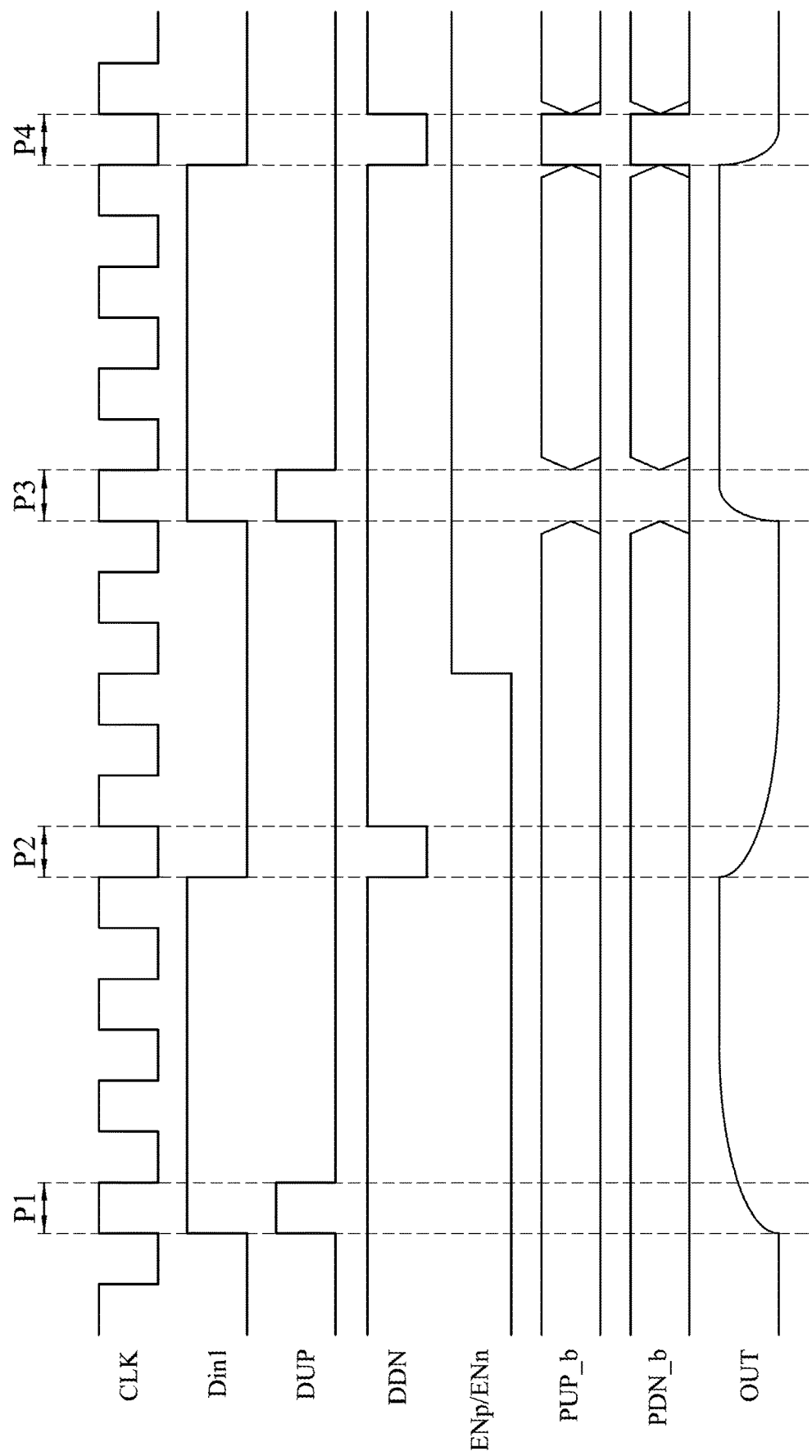
FIG. 7 is a schematic diagram illustrating signals of an off chip driving system in accordance with some embodiments of the disclosure.

Please refer to FIG. 7. FIG. 7 is a schematic diagram illustrating signals of an off chip driving system 100 in accordance with some embodiments of the disclosure. For the convenience of explanation, the operations of the adjustable enhancement circuits AEC1_1~AEC1_y and AEC2_1~AEC2_z illustrated in FIGS. 1, 5 and 6 are explained with accompanying of the signals of FIG. 7. As shown in FIG. 7, when the input data Din1 is at the high level, the pull-up driving circuit 162 will provide the system high voltage to the input/output pad I/O, so as to increase the level of the output signal OUT. And when the input data Din1 is at the low level, the pull-down driving circuit 164 will provide the system low voltage to the input/output pad I/O, so as to decrease the level of the output signal OUT.

Specifically, the number of the P-type drivers that are turned on is controlled by the number of the pull-up control signals that are at the low level, and the number of the pull-up control signals that are at the low level is based on pre-configured number of first optional signals. Similarly, the number of the N-type drivers that are turned on is controlled by the number of the pull-down control signals that are at the high level, and the number of the pull-down control signals that are at the high level is based on pre-configured number of second optional signals. The pre-configured number is determined by ZQ-calibration.

For example, if the pre-configured number is 2, when the input data Din1 is at the high level, two pull-up control signals (e.g. PUP_b1 and PUP_b2) becomes the low level according to the two first optional signals (e.g. OPTp_1 and OPTp_2), and two of the P-type drivers (e.g. Pd1 and Pd2) are turned on in response to the pull-up control signals (e.g. PUP_b1 and PUP_b2). At the same time, the other P-type drivers (e.g. Pd3~Pdy) are turned off in response to the corresponding pull-up control signals (e.g. PUP_b3~PUP_by) which are at the high level according to the other first optional signals (e.g. OPTp_3~OPTp_y).

For another example, if the pre-configured number is 1, when the input data Din1 is at the low level, one of the pull-down control signals (e.g. PDN_b1) becomes the high level according to the one of the second optional signals (e.g. OPTn_1), and one of the N-type drivers (e.g. Nd1) is turned on in response to the corresponding pull-down control signal (i.e., PDN_b1). At the same time, the other N-type drivers (e.g. Nd2~Ndz) are turned off in response to the corresponding pull-down control signals (e.g. PDN_b2~PDN_bz) which are at the low level according to the other second optional signals (e.g. OPTn_2~OPTn_z).

Accordingly, the output signal OUT of the input/output pad I/O should ideally be the same as the input data Din1. However, in high speed data transmission, the amplitude of the transmitted signals will be attenuated. As the frequency increases, the data signals become more severely distorted during transmission. For example, at the beginning of the input data Din1 turning from low level to high level, the output data of the output signal OUT, as the waveform of a time period P1 shown in FIG. 7, is too low to be clear. Similarly, at the beginning of the input data Din1 turning from high level to low level, the output data of the output signal OUT, as the waveform of a time period P2 shown in FIG. 7, is too high to be clear.

Therefore, in the present disclosure, the decision circuit 120 is configured to detect the time point when the input signal Din1 changes from low to high so as to generate and output a high pulse as the first decision signal DUP, and configured to detect the time point when the input signal Din1 changes from high to low so as to generate and output a low pulse as the second decision signal DDN. And the adjustable enhancement circuits AEC1_1~AEC1_y and AEC2_1~AEC2_z of the OCD front-end driving circuit 140 are controlled by the enabling signals ENp and ENn to generate the control signals PUP_b and PDN_b according to the decision signals DUP and DDN. When the enabling signals ENp and ENn are at the high level, the levels of the control signals PUP_b and PDN_b are based on the first decision signal DUP and the second decision signal DDN. When the enabling signals ENp and ENn are at the low level, the levels of the control signals PUP_b and PDN_b are based on the optional signals OPTp_1~OPTp_y and OPTn_b1~OPTn_bz, respectively, and the optional signals OPTp_1~OPTp_y and OPTn_b1~OPTn_bz are determined by ZQ-calibration.

Specifically, when the enabling signals ENp and ENn are at the high level, if the first decision signal DUP and the second decision signal DDN are both at the high level (i.e., at the high pulse of the first decision signal DUP), all of the pull-up control signals PUP_b1~PUP_by generated by the first adjustable enhancement circuits AEC1_1~AEC1_y and all of the pull-down control signals PDN_b1~PDN_bz generated by the second adjustable enhancement circuits AEC2_1~AEC2_z are all at the low level. Therefore, in respond to the control signals PUP_b1~PUP_by and PDN_b1~PDN_bz, all of the P-type drivers Pd0~Pdy are turned off and all of the N-type drivers Nd0~Ndz are turned on. That is, the P-type drivers fast turned on to make the output signal OUT pull high, and the N-type drivers fast turned off to make the output signal OUT not leak to low. Thus, the slew rate of rising the output signal OUT can be improved.

Similarly, when the enabling signals ENp and ENn are at the high level, if the first decision signal DUP and the second decision signal DDN are both at the low level (i.e., at the low pulse of the second decision signal DDN), all of the pull-up control signals PUP_b1~PUP_by generated by the first adjustable enhancement circuits AEC1_1~AEC1_y and all of the pull-down control signals PDN_b1~PDN_bz generated by the second adjustable enhancement circuits AEC2_1~AEC2_z are all at the high level. Therefore, in respond to the control signals PUP_b1~PUP_by and PDN_b1~PDN_bz, all of the P-type drivers Pd0~Pdy are turned on and all of the N-type drivers Nd0~Ndz are turned off. That is, the P-type drivers fast turned off to make the output signal OUT not charge to high, and the N-type drivers fast turned on to make the output signal OUT pull low. And thus the slew rate of dropping the output signal OUT can be improved.

In addition, when the first decision signal DUP is at the low level and the second decision signal DDN is at the high level (i.e., period without pulse), the levels of the pull-up control signals PUP_b1~PUP_by generated by the first adjustable enhancement circuits AEC1_1~AEC1_y are based on the first optional signals OPTp_1~OPTp_y, respectively, and the levels of the pull-down control signals PDN_b1~PDN_bz generated by the second adjustable enhancement circuits AEC2_1~AEC2_z the are based on the second optional signals OPTn_1~OPTn_z, respectively. That is, while the input signal Din1 is not changing, only the drivers corresponding to the pre-configured optional signals operate. It is similar to the status when the enabling signals ENp and ENn are at the low level, and thus the explanation is omitted.

In this way, no matter what the pre-configured number determined by ZQ-calibration is, by setting the enabling signals ENp and ENn to the high level, all the P-type drivers Pd0~Pdy are turned on while the input signal Din1 is turning from low to high, and all the N-type drivers Nd0~Ndz are turned on while the input signal Din1 is turning from high to low, so that the slew rate of the output signal OUT can be greater and thus the output data of the input/output pad I/O, as the waveform of the time periods P3 and P4 shown in FIG. 7, is able to be clearer (less distortion).

It should be noted that, though in the above description, all drivers Pd0~Pdy or Nd0~Ndz will operate when the enabling signals ENp and ENn is at the high level, it is not intended to limit the present disclosure. In other words, in some other embodiments, the number of the drivers Pd0~Pdy or Nd0~Ndz that operate may also be configured by the number of the enabling signals ENp and ENn.

Furthermore, the clock CLK illustrated in FIG. 1 is merely an example, in some embodiments, the decision circuit 120 is able to generate the input data Din1, the first decision signal DUP and the second decision signal DDN without the clock CLK. The input data Din1 is the input data Din0 with delay so as to align the signals processed by the decision circuit 120.

In some embodiments, the decision circuit 120 may be realized by some components of a feed forward equalizer or some components of pre-emphasis decision technical circuit. Specifically, the decision circuit 120 receives the input data Din1 and compares the voltage level of the next input data and the present one. When the voltage level of the next input data is higher than the voltage level of the present input data, the decision circuit 120 generates a pulse of the first decision signal DUP (as the waveform show in time periods P1 and P3 of FIG. 7). When the voltage level of the next input data is lower than the voltage level of the present input data, the decision circuit 120 generates a pulse of the second decision signal DDN (as the waveform show in time periods P2 and P4 of FIG. 7).

In the foregoing, exemplary operations are included. However, these operations do not need to be performed sequentially. The operations mentioned in the embodiment may be adjusted according to actual needs unless the order is specifically stated, and may even be performed simultaneously or partially simultaneously.

It is noted that, the drawings, the embodiments, and the features and circuits in the various embodiments may be combined with each other as long as no contradiction appears. The circuits illustrated in the drawings are merely examples and simplified for the simplicity and the ease of understanding, but not meant to limit the present disclosure. In addition, those skilled in the art can understand that in various embodiments, circuit units may be implemented by different types of analog or digital circuits or by different chips having integrated circuits. Components may also be integrated in a single chip having integrated circuits. The description above is merely by examples and not meant to limit the present disclosure.

In summary, in various embodiments of the present disclosure, the number of the control signals PUP and PDN that are at the enabling level is controlled by the enabling signals ENp and ENn and optional signals OPTp and OPTn, and the time point of the control signals PUP and PDN that are at the enabling level is controlled by the decision signals DUP and DDN. When and how many the drivers Pd0~Pdy and Nd0~Ndz that are turned on are based on the corresponding control signals PUP and PDN. Therefore, the slew rates of rising and dropping the output signal OUT are able to be controlled and to meet actual demand.

Although specific embodiments of the disclosure have been disclosed with reference to the above embodiments, these embodiments are not intended to limit the disclosure. Various alterations and modifications may be performed on the disclosure by those of ordinary skills in the art without departing from the principle and spirit of the disclosure. Thus, the protective scope of the disclosure shall be defined by the appended claims.

What is claimed is:

1. An off chip driving system, comprising:
  a decision circuit, configured to output a first decision signal and a second decision signal according to a clock and an input data;
  a plurality of first adjustable enhancement circuits, coupled to the decision circuit, wherein each first adjustable enhancement circuit is configured to generate one of a plurality of first control signals in response to the first decision signal, the second decision signal and one of a plurality of first optional signals;
  a plurality of second adjustable enhancement circuits, coupled to the decision circuit, wherein each second adjustable enhancement circuit is configured to generate one of a plurality of second control signals in response to the first decision signal, the second decision signal and one of a plurality of second optional signals;
  a pull-up circuit, comprising a plurality of first drivers, wherein each first driver is coupled to a corresponding one of the first adjustable enhancement circuits and configured to be enabled in response to a corresponding one of the first control signals; and
  a pull-down circuit, comprising a plurality of second drivers, wherein each second driver is coupled to a corresponding one of the second adjustable enhancement circuits and configured to be enabled in response to a corresponding one of the second control signals.

2. The off chip driving system of claim 1, wherein the decision circuit is configured to generate a pulse with a high level as the first decision signal when the input data turns from a first level to a second level, and to generate a pulse with a low level as the second decision signal when the input data turns from the second level to the first level.

3. The off chip driving system of claim 1, wherein when the first decision signal and the second decision signal are both at a low level, the first adjustable enhancement circuits and the second adjustable enhancement circuits provide a system high voltage as all the first control signals and the second control signals, so that all the first drivers turn off and all the second drivers turn on, when the first decision signal and the second decision signal are both at a high level, the first adjustable enhancement circuits and the second adjustable enhancement circuits provide a system low voltage as all the first control signals and the second control signals, so that all the first drivers turn on and all the second drivers turn off.

4. The off chip driving system of claim 1, wherein when the first decision signal is at a low level and the second decision signal is at a high level, the first adjustable enhancement circuits provide the first optional signals as the first control signals respectively, and the second adjustable enhancement circuits provide the second optional signals as the second control signals respectively, so that a part of the first drivers and the second drivers turn off and the other part of the first drivers and the second drivers turn on.

5. The off chip driving system of claim 1, wherein each one of the first adjustable enhancement circuits and the second adjustable enhancement circuits comprises:
  a first multiplexer, configured to receive the first decision signal, a system low voltage and an enabling signal, to output the first decision signal when the enabling signal is at a high level, and to output the system low voltage when the enabling signal is at a low level;
  a second multiplexer, configured to receive the second decision signal, a system high voltage and the enabling signal, to output the second decision signal when the enabling signal is at the high level, and to output the system high voltage when the enabling signal is at the low level; and
  a third multiplexer, coupled to the first multiplexer and the second multiplexer, configured to receive the system low voltage, the system high voltage, the corresponding one of the first optional signals and the second optional signals, a third decision signal from the first multiplexer and a fourth decision signal from the second multiplexer, and configured to output the corresponding one of the first control signals and the second control signals in response to the third decision signal and the fourth decision signal.

6. The off chip driving system of claim 5, wherein the third multiplexer is configured to output the system low voltage as the corresponding control signal when the third decision signal and the fourth decision signal are at the high level, to output the system high voltage as the corresponding control signal when the third decision signal and the fourth decision signal are at the low level, and to output the corresponding optional signal when the third decision signal is at the low level and the fourth decision signal is at the high level.

7. The off chip driving system of claim 1, wherein the first drivers are PMOS, and the second drivers are NMOS.

8. A signal compensation method, comprising:
  generating a pulse with a high level as a first decision signal when an input data turns from a first level to a second level;
  generate a pulse with a low level as a second decision signal when the input data turns from the second level to the first level;
  generating a plurality of first control signals in response to the first decision signal, the second decision signal and a plurality of first optional signals respectively;
  generating a plurality of second control signals in response to the first decision signal, the second decision signal and a plurality of second optional signals respectively;
  enabling a plurality of first drivers in response to the first control signals respectively; and
  enabling a plurality of second drivers in response to the second control signals respectively.

9. The signal compensation method of claim 8, further comprising:
  providing a system high voltage as all the first control signals and the second control signals when the first decision signal and the second decision signal are both at a low level, so that all the first drivers turn off and all the second drivers turn on; and
  providing a system low voltage as all the first control signals and the second control signals when the first decision signal and the second decision signal are both at a high level, so that all the first drivers turn on and all the second drivers turn off.

10. The signal compensation method of claim 8, further comprising:
  providing the first optional signals as the first control signals respectively when the first decision signal is at a low level and the second decision signal is at a high level, so that a part of the first drivers turn off and the other part of the first drivers turn on; and
  providing the second optional signals as the second control signals respectively when the first decision signal is at the low level and the second decision signal is at the high level, so that a part of the second drivers turn off and the other part of the second drivers turn on.

* * * * *